United States Patent [19]

Nakai et al.

[11] Patent Number: 5,616,507
[45] Date of Patent: Apr. 1, 1997

[54] METHOD OF MANUFACTURING SUBSTRATE HAVING SEMICONDUCTOR ON INSULATOR

[75] Inventors: Tetsuya Nakai, Saitama-ken; Yasuo Yamaguchi; Tadashi Nishimura, both of Hyogo-ken, all of Japan

[73] Assignees: Mitsubishi Denki Kabushiki Kaisha; Mitsubishi Materials Corporation, both of Tokyo, Japan

[21] Appl. No.: 444,590

[22] Filed: May 19, 1995

Related U.S. Application Data

[62] Division of Ser. No. 17,257, Feb. 12, 1993, Pat. No. 5,441,899.

[30] Foreign Application Priority Data

Feb. 18, 1992 [JP] Japan .................................. 4-030606
Dec. 11, 1992 [JP] Japan .................................. 4-331426

[51] Int. Cl.⁶ .................................................. H01L 21/76
[52] U.S. Cl. ........................... 438/480; 438/766; 438/476
[58] Field of Search .................................. 437/24, 62, 26; 148/DIG. 3

[56] References Cited

FOREIGN PATENT DOCUMENTS

| 2591795 | 11/1986 | France . |
| 220812 | 4/1985 | Germany . |
| 57-104239 | 6/1982 | Japan . |
| 61-144018 | 7/1986 | Japan . |
| 1179431 | 7/1989 | Japan . |

OTHER PUBLICATIONS

U. Bussmann et al., "Silicon–on–insulator device islands formed by oxygen implantation through patterned masking layers," Journal of Applied Physics, vol. 70, No. 8, Oct. 15, 1991, pp. 4584–4592.

N. Guillemot et al., "Suppression of oxidation stacking faults in silicon separation by oxygen," Materials Science & Engineering B12, Jan. 20, 1992, pp. 47–51.

J. R. Davis et al., "Dielectrically isolated silicon–on–insulator islands by masked oxygen implantation," Applied Physics Letters, vol. 51, No. 18, Nov. 2, 1987 pp. 1491–1421.

"Dislocation Formation Related with High Oxygen Dose Implantation on Silicon," by J. Stoemenos et al., J. Appl. Phys., vol. 69, No. 2, Jan. 15, 1991, pp. 793–802.

"The Reduction of Dislocations in Oxygen Implanted Silicon–On–Insulator Layers by Sequential Implantation and Annealing," by Dale Hill et al., J. Appl. Phys., vol. 63, No. 10, May 15, 1988, pp. 4933–4936.

"Formation of Low Dislocation Density Silicon–On–Insulator by a Single Implantation and Annealing," by M. K. EL–Ghor et al., Appl. Phys. Lett., vol. 57, No. 2, Jul. 9, 1990, pp. 156–158.

"The Effect of 1300–1380°C Anneal Temperatures and Material Contamination on the Characteristics of CMOS/ SIMOX Devices," L. Jastrzebski et al., IEEE Electron Device Letters, vol. 9, No. 3, Mar. 1988, pp. 151–153.

*Primary Examiner*—George Fourson
*Attorney, Agent, or Firm*—Lowe, Price, LeBlanc & Becker

[57] ABSTRACT

A polysilicon layer is formed on a surface of a silicon substrate after oxygen ions are implanted into the silicon substrate and an $SiO_2$ film is formed in the silicon substrate at a position in a prescribed depth from the surface of silicon substrate. A heat treatment is performed to a silicon layer between the polysilicon layer and the $SiO_2$ film, thereby providing an SOI layer with improved crystal quality.

1 Claim, 6 Drawing Sheets

METHOD OF MANUFACTURING SUBSTRATE HAVING SEMICONDUCTOR ON INSULATOR

This application is a division of Application Ser. No. 08/017,257 filed Feb. 12, 1993 now U.S. Pat. No. 5,441,899.

BACKGROUND OF THE INVENTION

1. Field of the Invention

The present invention relates generally to methods of manufacturing a substrate having a semiconductor on an insulator, and more specifically, to a method of manufacturing an SOI substrate by an SIMOX (Separation by Implanted Oxygen) method.

2. Description of the Background Art

A wafer formed of an insulating substrate and a monocrystalline silicon thin film formed thereon is called SOI (Silicon On Insulator). When a semiconductor device such as an MOS (Metal Oxide Semiconductor) field effect transistor is formed on such a monocrystalline silicon thin film, high speed operation of the device can be achieved by the decrease of parasitic capacitance and the increase of current driving capability, and a short channel effect can effectively be reduced. Conventionally, many approaches have been proposed to form an SOI structure, and the SIMOX method for forming an SOI structure by implanting oxygen ions of a high concentration into a silicon substrate is one of such approaches. Hereinafter, the SIMOX method will be described.

The SIMOX method is a method of forming a buried film (SiO$_2$ film) directly inside a silicon substrate by implanting oxygen ions into the silicon substrate with an accelerating energy of 200 keV, in a dose amount of 2.0×10$^{18}$/cm$^2$, and then performing an enough thermal treatment at a temperature of 1300° C. or higher in a mixed gas of Ar/O$_2$ or N$_2$/O$_2$. Now, a method of manufacturing an SOI substrate by a conventional SIMOX method will be described in detail in conjunction with the drawings.

Figure 5A:
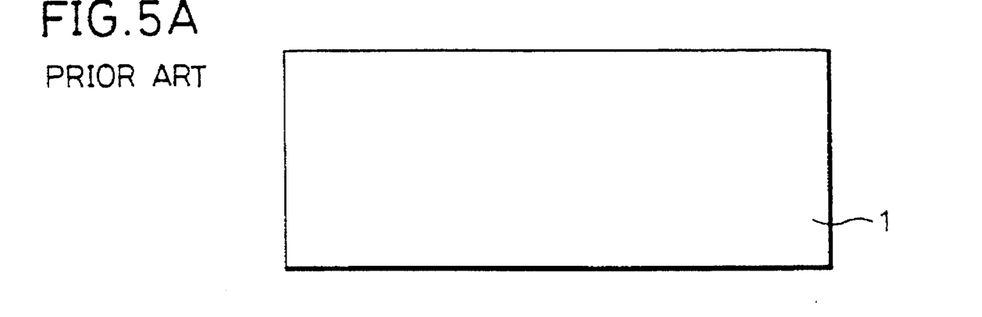
FIGS. 5A to 5D are views showing steps in a manufacturing step of a conventional SOI substrate by an SIMOX method.
Figure 5B:
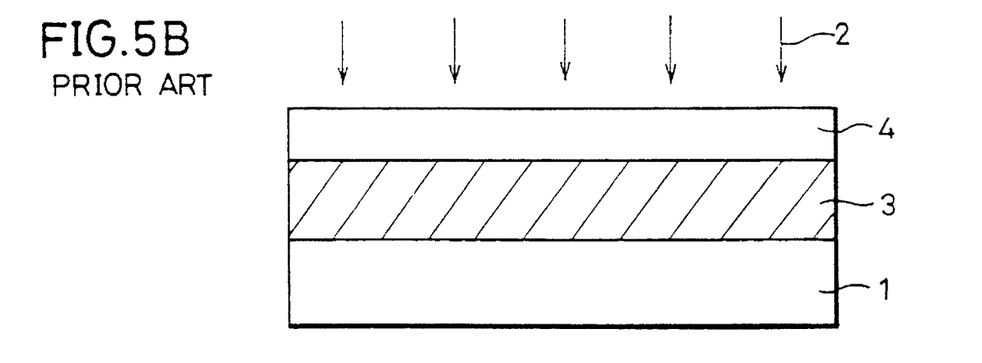
Figure 5C:
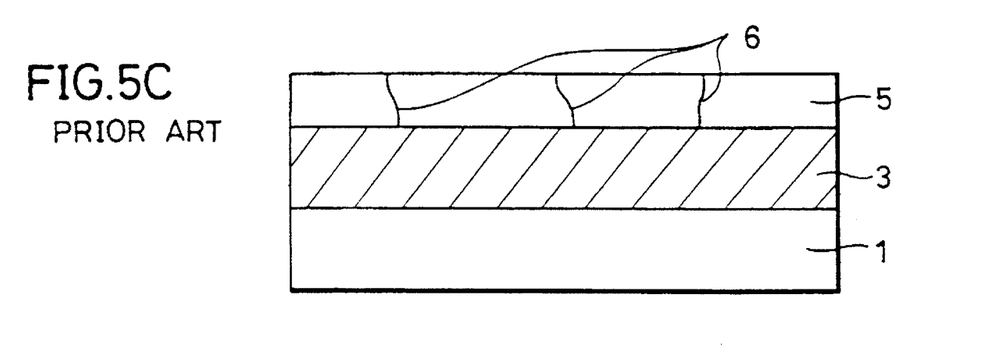

FIGS. 5A–5C are views showing steps in a manufacturing method of an SOI substrate by a conventional SIMOX method.

Referring to FIG. 5A, a silicon substrate 1 is prepared.

Referring to FIG. 5B, oxygen ions 2 are implanted from an upper surface of silicon substrate 1 with silicon substrate 1 being heated at a temperature from 500° C. to 600° C. The implantation condition is, for example, with an accelerating energy of 200 keV in a dose amount of 2.0×10$^{18}$/cm$^2$. The implantation of oxygen ions 2 causes a reaction of silicon substrate 1 and oxygen ions 2, and a buried insulating film (hereinafter referred to as SiO$_2$ film) 3 is formed. SiO$_2$ film 3 is formed at a position in a prescribed depth from the upper surface of silicon substrate 1, and therefore a silicon layer 4 is present on SiO$_2$ film 3.

Referring to FIG. 5C, a heat treatment at a temperature of 1300° C. or higher is performed in an atmosphere of Ar/O$_2$ for about five hours. Thus, defects produced by the implantation of oxygen ions 2 disappear, crystal quality is recovered, and a monocrystalline silicon layer (hereinafter referred to as SOI layer) 5 is formed as a result. However, since the oxygen ions 2 are implanted in a large amount into silicon substrate 1, various defects result and these defects do not disappear by a heat treatment at a temperature of 1000° C. or higher. Conversely, by a high temperature heat treatment, these fine defects grow to form defects in a line shape which reach from the surface of silicon layer 4 to the boundary surface of silicon layer 4 and SiO$_2$ film 3. This is called a threading dislocation 6.

Figure 5D:
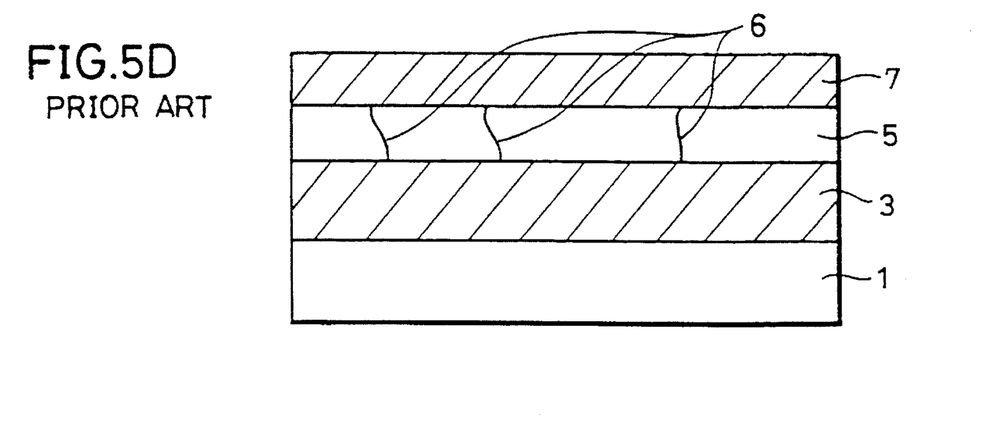

Further in order to prevent a reaction with the atmosphere of Ar/O$_2$ at the time of the above-stated heat treatment, a protecting film (SiO$_2$) 7 is formed on the surface of silicon substrate 1 as illustrated in FIG. 5D in some cases.

Figure 6:
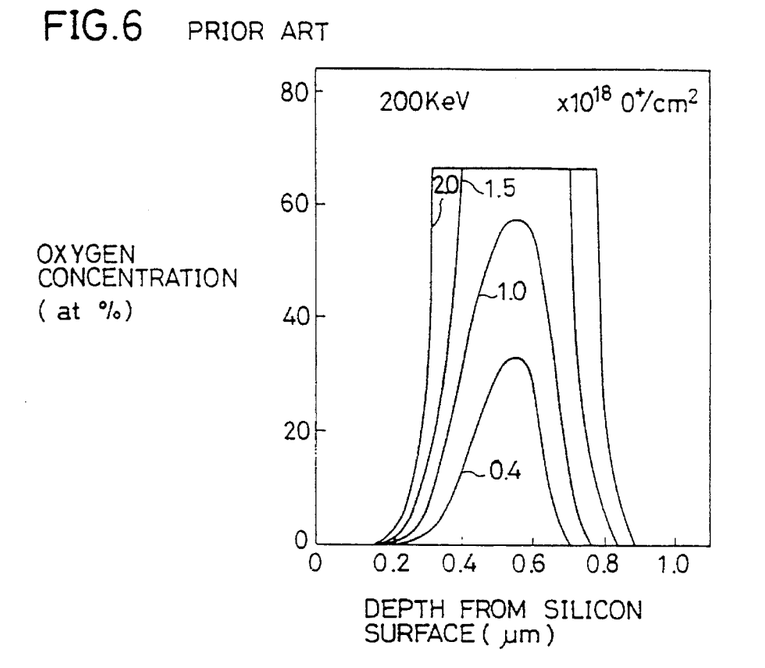
FIG. 6 is a representation showing oxygen concentration in a silicon substrate relative to the amount of implanted oxygen ions.

Now, conditions for implanting ions employed in manufacturing an SOI substrate will be described in the following. FIG. 6 is a representation showing the oxygen concentration in silicon substrate 1 relative to the amount of oxygen ions 2 implanted. Assume that the accelerating energy is 200 keV. In FIG. 6, if the amount of oxygen ions 2 implanted is small, oxygen gives a Gauss distribution in silicon substrate 1 and SiO$_2$ film 3 is not formed in silicon substrate 1. If, however, the amount of oxygen ions 2 implanted is more than a critical implanting amount (1.35×10$^{18}$/cm$^2$) necessary for forming SiO$_2$ film 3 in silicon substrate 1, the oxygen concentration near the peak of implantation goes beyond the number of oxygen atoms per 1 cm$^3$ contained in SiO$_2$, in other words the stoichiometric concentration for SiO$_2$ (4.4× 10$^{22}$/cm$^3$). Therefore, excessive oxygen diffuses toward the leading and trading edges of the distribution and reacts with silicon substrate 1 to form SiO$_2$, thus providing SiO$_2$ film 3 having a sharp interface in silicon substrate 1. The reaction at that time is represented as follows:

$$xSi+2O_i \rightarrow SiO_2+(x-1)Si_i \qquad (1)$$

(O$_i$: interstitial oxygen, Si$_i$: interstitial silicon)

Herein, the interstitial oxygen means oxygen atoms which come between interstices and are not coupled to other atoms, and the interstitial silicon means silicon atoms which come between interstices and are not coupled to other atoms. SiO$_2$ is formed by implanting oxygen ions 2 in an amount more than the critical implantation amount, but the interstitial silicon is discharged in order to restrain the increase in volume which takes place in accordance with the implantation. The interstitial silicon is absorbed into the surface of silicon substrate 1 to be a sink. However, with the increase in the amount of oxygen ion 2 implanted, the number of silicon atoms between interstices produced is increased, and in the meantime excessive silicon atoms between interstices get together to remain as a defect in silicon layer 4. The defect is stabilized as a threading dislocation 6 fixed between the surface of silicon substrate 1 and SiO$_2$ film 3 in the following heat treatment step, resulting in the degradation of the crystal quality of silicon substrate 1. The mechanism of such dislocation formation is described, for example by J. Stoemenos et al., in J. Appl. Phys., Vol. 69, No. 2, 15 Jan. 1991 pp. 793–802.

Figure 7:
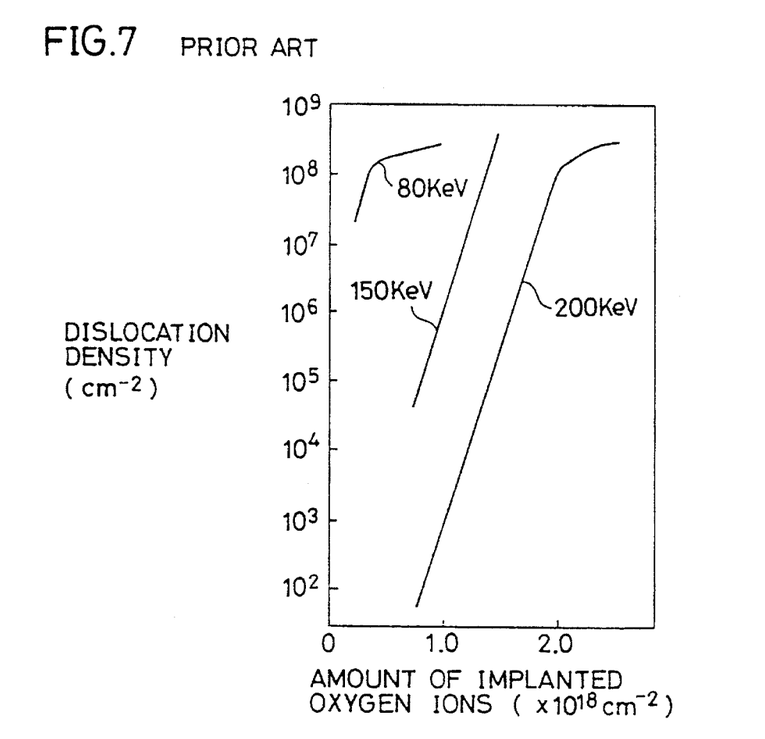
FIG. 7 is a representation showing the relation between dislocation density and the amount of oxygen ions implanted in an SOI layer at each accelerating voltage.

The density of threading dislocation 6 depends on ion implantation conditions. FIG. 7 is a representation showing the dependence of the dislocation density in an SOI layer on the amount of oxygen ion implanted and the accelerating voltage. As illustrated in FIG. 7, as the amount of oxygen ion implanted increases and the accelerating voltage is reduced, the dislocation density tends to increase. There exists a method of multi-ion implantation (multi-stages implantation) method which takes advantage of the relativity between the amount of implantation and the density of defects in order to form a high quality SiO$_2$ film 3 without producing threading dislocation 6. Such a multi-ion implantation (multi-stage implantation) method is reported by D. Hill et al., in J. Appl. Phys., Vol. 63, No. 10, 15 May 1988 pp. 4933–4936. By this method implantation of oxygen ions is performed in a smaller amount (in the range from 0.5 to $1.0 \times 10^{18}/cm^2$) than a conventional method in order to reduce dislocation density, then crystal quality is recovered, $SiO_2$ is precipitated by a heat treatment, and this implantation and heat treatment steps are repeated a number of times in order to obtain a prescribed amount of implantation. According to this method, an SOI substrate having a quite good quality $SiO_2$ film with its $Si/SiO_2$ interface being very sharp and the dislocation density in the SOI layer being $10^3/cm^2$ or smaller is produced. This method however includes a complicated process and is not suitable for commercial mass production.

Another method of reducing dislocation density is proposed by M. K. EL-Ghor et al., in Appl. Phys., Lett., Vol. 57, No. 2, 9 Jul. 1990 pp. 156–158. According to this method, a cavity (hollow space) of a high density is formed in an SOI layer at the time of implanting oxygen ions, and this cavity functions as a sink for interstitial silicon, thus reducing the dislocation density.

Figure 8:
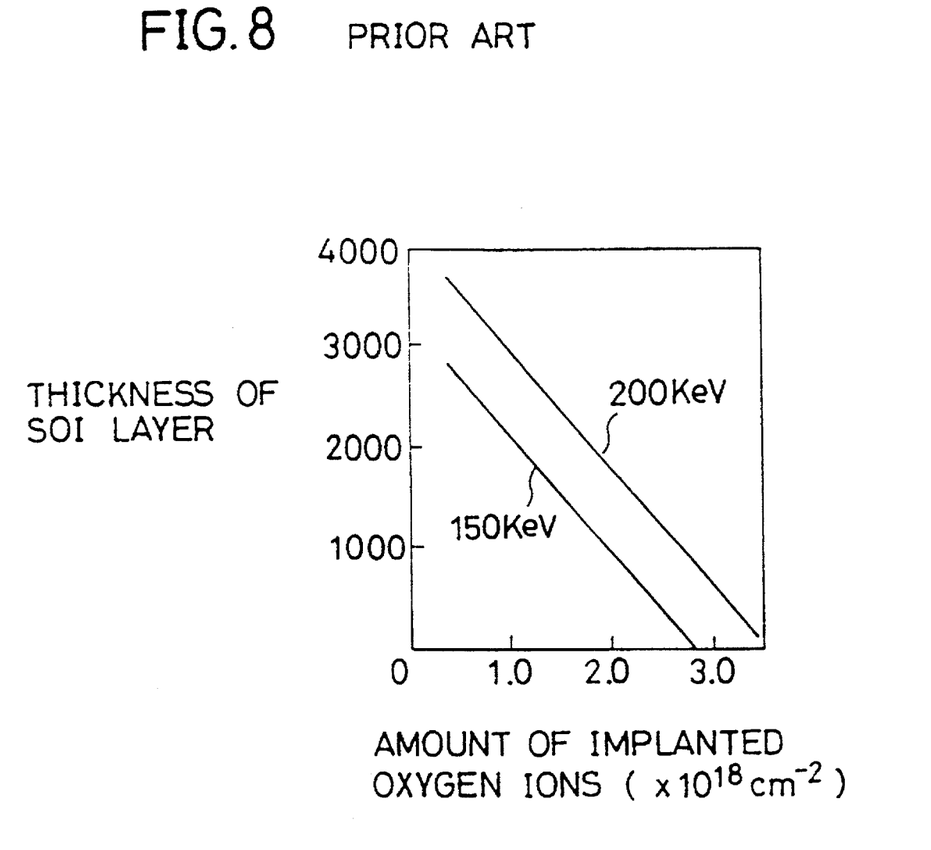
FIG. 8 is a representation showing the thickness of an SOI layer, the amount of oxygen ions implanted and accelerating voltage dependency.

In order to use an SOI substrate as a substrate for producing a thin film SOI/MOS field effect transistor, the thickness of the SOI layer should be 1000 Å or smaller. FIG. 8 shows the relation between the thickness of the SOI layer, the amount of implanted oxygen ions, and accelerating voltage. The thickness of SOI layer, as illustrated in FIG. 8, can be reduced as the amount of implanted oxygen ions increases as well as the accelerating voltage is reduced. Any of these conditions however increase the dislocation density, and therefore a method of satisfying the conditions for the thickness of the SOI layer and the dislocation density has not been developed. Furthermore, in steps of ion implantation and heat treatment in an SIMOX method, silicon substrate 1 is contaminated by an impurity from the apparatus.

As described above, in the method of manufacturing the SOI substrate according to the conventional SIMOX method, threading dislocation 6 remains in the SOI substrate or silicon substrate 1 is contaminated with the impurity. Therefore, the crystal quality degrades, and when an MOS field effect transistor is formed on the SOI substrate, the defects or the impurity are taken by a gate oxide film at the time of forming the film. This results in breakdown voltage deficiency and increase in power consumption by current generated by the defects present in the depletion layer, thus deteriorating the characteristic of the device. Furthermore, since a thin film SOI layer of 1000 Å or smaller cannot be provided without letting threading dislocation 6 remain, this method of manufacturing the SOI substrate is not suitable for manufacturing a substrate for producing a thin film SOI/MOS field effect transistor.

SUMMARY OF THE INVENTION

It is an object of the invention to provide a method of manufacturing a substrate which can prevent a threading dislocation from being produced in a semiconductor on an insulator.

Another object of the invention is to provide a method of manufacturing a substrate permitting reduction of the thickness of a semiconductor on an insulator.

Yet another object of the invention is to provide a method of manufacturing a substrate free from contamination of a semiconductor on insulator by an impurity.

A method of manufacturing in accordance with a first aspect of the invention is a method of manufacturing a substrate having a semiconductor on an insulator and includes the following steps.

A covering layer is formed on a main surface of a semiconductor substrate. Ions are implanted into the semiconductor substrate through the covering layer, and an insulating layer is formed in the semiconductor substrate at a position in a prescribed depth from the main surface. A heat treatment is performed to a region of the semiconductor substrate between the covering layer and the insulating layer.

A manufacturing method according to a second aspect of the invention is a method of manufacturing an SOI substrate and includes the following steps.

A polycrystalline silicon layer is formed on a main surface of a silicon substrate. Oxygen ions are implanted into the silicon substrate through the polycrystalline silicon layer, and a silicon oxide layer is formed in the silicon substrate at a position in a prescribed depth from the main surface. A heat treatment is performed to a region of the silicon substrate between the polycrystalline silicon layer and the silicon oxide layer.

In the manufacturing method according to the first and second aspects of the invention, after the covering layer (polycrystalline silicon layer, for example) is formed on the main surface of the semiconductor substrate (silicon substrate, for example), the insulating layer (silicon oxide layer, for example) is formed by ion implantation (implantation of oxygen ions, for example), and heat treatment. Therefore, grain boundaries or the like in the polycrystalline silicon layer absorb a large amount of interstitial silicon produced in the silicon layer on the silicon oxide layer in accordance with the formation of, for example, silicon oxide layer. Thus, generation of threading dislocations in the silicon layer on the silicon oxide layer can be prevented. Controlling the thickness of the covering layer formed of, for example, a polycrystalline layer permits reducing the depth to which oxygen ions to be implanted, so that the thickness of the silicon layer on the silicon oxide layer can be reduced.

A manufacturing method according to a third aspect of the invention is a method of manufacturing an SOI substrate and includes the following steps.

Oxygen ions are implanted into a silicon substrate from a main surface of the silicon substrate having an element formation region and an element isolation region, and a silicon oxide layer is formed at a position in a prescribed depth from the main surface as a result. A silicon oxide film is formed on the element isolation region. A polycrystalline silicon layer is formed on the element formation region and the silicon oxide film. A heat treatment is performed to a region of the silicon substrate between the silicon oxide layer and the polycrystalline silicon layer. After a heat treatment, the surface of the silicon oxide film is exposed and the polycrystalline silicon layer is removed so as to leave the polycrystalline silicon layer on the element formation region. Then, the silicon oxide film is removed. The polycrystalline silicon layer is etched away.

In the manufacturing method according to the third aspect of the invention, a heat treatment is performed with the polycrystalline silicon layer being formed on the silicon substrate in the element formation region. Therefore, grain boundaries or the like in the polycrystalline silicon layer absorb interstitial silicon in the silicon layer on the silicon oxide layer. Accordingly, the formation of threading dislocations in the silicon layer in the element formation region can be prevented. Furthermore, after the thickness of the polycrystalline silicon layer is once reduced, the remaining polycrystalline silicon layer is etched away. Therefore, time required for etching at the time of the etching away can be reduced, thereby preventing the underlying silicon layer from being overetched in accordance with the etching of the polycrystalline silicon layer. Therefore, the thickness of the silicon layer on the silicon oxide layer can be formed even.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Steps of manufacturing an SOI method in accordance with one embodiment of the invention will be described in conjunction with FIGS. 1A to 1D. Since the basic manufacturing steps are substantially identical to those described in conjunction with the conventional technology, only the points different from the conventional technology will be described in the following.

Figure 1A:
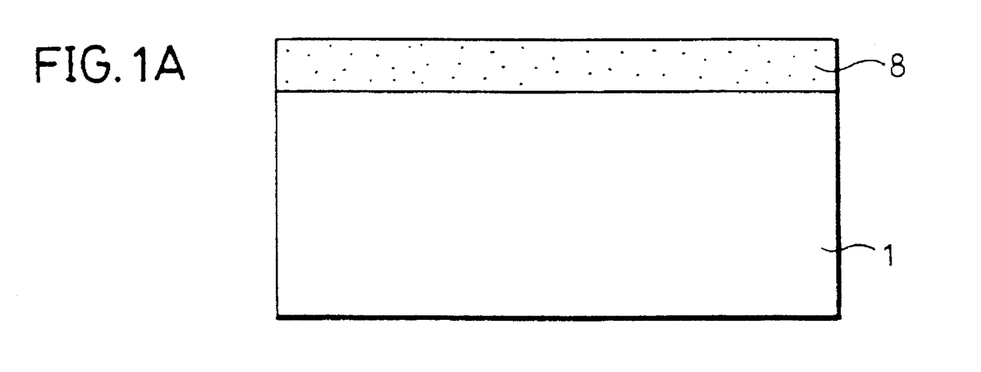
FIGS. 1A–1D are views showing steps in a manufacturing method of an SOI substrate in accordance with Embodiment 1 of the invention.

Referring to FIG. 1A, a silicon substrate 1 is prepared. A polysilicon layer 8 is formed on a surface of silicon substrate 1.

Figure 1B:
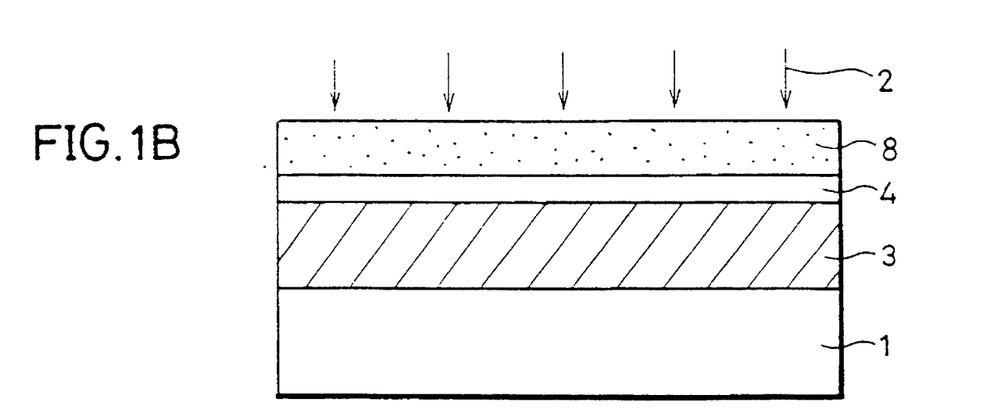

Referring to FIG. 1B, oxygen ions 2 are implanted into silicon substrate 1 through polysilicon layer 8. By this implantation, an $SiO_2$ film 3 is formed at a position in a prescribed depth in silicon substrate 1. Since $SiO_2$ film 3 is formed in the position in the prescribed depth from the surface of silicon substrate 1, a silicon layer 4 is present on $SiO_2$ film 3.

Figure 1C:
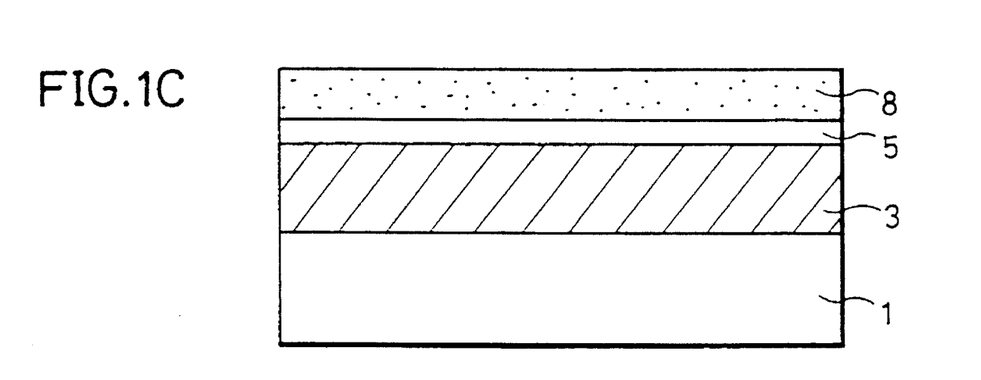

Referring to FIG. 1C, a heat treatment is performed at a temperature of about 1300° C. Thus, the crystal quality of silicon layer 4 is improved, and an SOI layer 5 is provided.

Figure 1D:
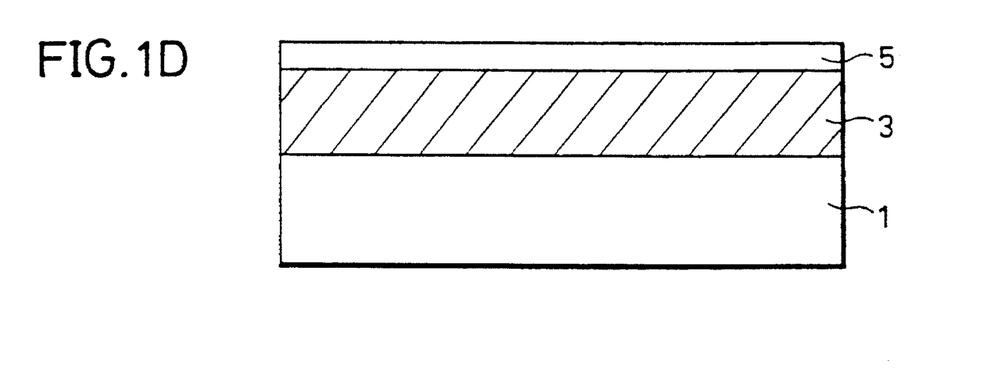

Referring to FIG. 1D, after the above-described heat treatment, a polysilicon layer 8 on a surface of silicon layer 4 is etched away and an SOI substrate of a good quality having SOI layer 5 with an improved crystal quality is provided.

Many grain boundaries which can be a sink for interstitial silicon are present in polysilicon layer 8. A large amount of interstitial silicon produced in accordance with the formation of $SiO_2$ at the time of ion implantation and heat treatment can be absorbed, thereby greatly restraining the formation and growth of defects. The dislocation density of SOI layer 5 formed, for example, by implanting oxygen ions at an accelerating energy of 200 keV, in a dose amount $2.0 \times 10^{18}/cm^2$ can greatly be reduced from a conventional level of $1.0 \times 10^8 \ cm^2$ to $1.0 \times 10^3/cm^2$ thereby greatly improving the crystal quality.

Now, reduction of the thickness of SOI layer 5 will be described. As illustrated in FIG. 1B, since oxygen ions are implanted through polysilicon layer 8, the depth to which oxygen ions 2 enter is smaller than what would be if not for polysilicon layer 8 by the amount of the thickness of polysilicon layer 8. If, for example, oxygen ions are implanted at an accelerating energy of 200 keV, in a dose amount of $2.0 \times 10^{18}/cm^2$, as illustrated in FIG. 7, SOI layer 5 having a thickness of about 2000 Å is formed, and according to the invention the thickness of polysilicon layer 8 can be so set that SOI layer 5 of a prescribed thickness can be provided, whereby an SOI layer having a thickness of 1000 Å or smaller can readily be formed. For example, setting the thickness of polysilicon layer 8 to be 1500 Å, a thin film SOI layer 5 having a thickness of 500 Å can be provided.

Furthermore, providing stacking polysilicon layer 8 on silicon substrate 1 provides a function of gettering impurities in the silicon. Accordingly, the polysilicon layer 8 provides gettering of impurity mixed into at the time of ion implantation and heat treatment, thereby greatly reducing impurities in SOI layer 5.

The manufacturing method in accordance with the embodiment does not include complicated steps as opposed to the method of multi-ion implantation described in conjunction with the conventional technology and is therefore suitable for mass production. When an MOS field effect transistor is formed on SOI substrate 5, the breakdown voltage deficiency of a gate oxide film can be reduced, current produced by dislocations which is one cause for leakage current is reduced, and therefore junction leakage current between source/drain regions can be reduced, thereby reducing power consumption.

Embodiment 2

Figure 2:
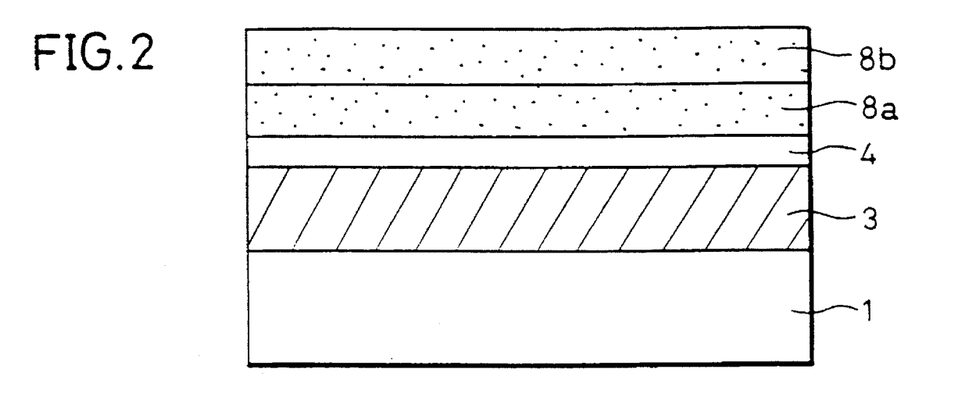
FIG. 2 is a view showing steps in a manufacturing method of an SOI substrate in accordance with Embodiment 2 of the invention.
Figure 3A:
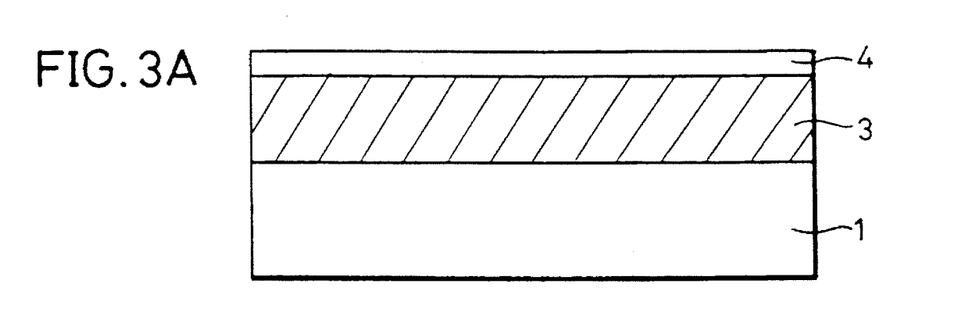
FIGS. 3A and 3B are views showing steps in a manufacturing method of an SOI substrate in accordance with Embodiment 2 of the invention.
Figure 3B:
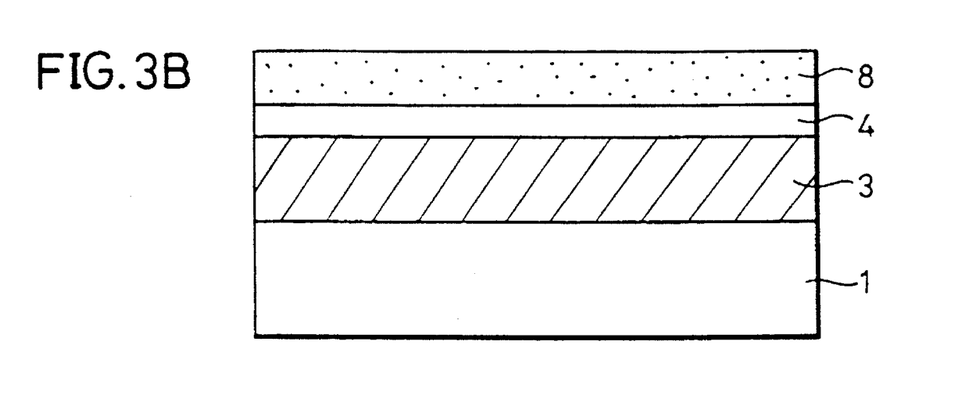

In the above-described Embodiment 1, the same polysilicon layer is utilized from the step of oxygen ion implantation to the step of heat treatment, but as illustrated in FIG. 2, after oxygen ion implantation, the same effect as Embodiment 1 can be provided if an additional polysilicon layer 8b is placed on a polysilicon layer 8a. As shown in FIGS. 3A and 3B, after oxygen ion implantation, the same effect as the embodiment 1 can also be provided if polysilicon layer 8 is removed and a new polysilicon layer 8 is formed.

Embodiment 3

Furthermore, in view of only the effect of reducing dislocation density and impurity contamination, the above-effect can be provided by performing one of the oxygen ion implantation and heat treatment steps with polysilicon layer 8 being stacked.

Embodiment 4

In Embodiment 1, the case has been described in which polysilicon layer 8 is stacked for the purpose of controlling sinks for interstitial silicon and the depth to which oxygen ions enter, the same effect as Embodiment 1 can be provided by using a polycrystalline layer of another material, an amorphous layer (including an amorphous silicon layer), or a silicon surface provided with a damage treatment provided that it can function as a sink for interstitial silicon.

Embodiment 5

In Embodiment 1, although the silicon semiconductor substrate, and oxygen as ion implantation atoms are utilized, the same effect can be provided utilizing any semiconductor substrate and ion atoms if an insulator can be formed in the semiconductor substrate by ion implantation.

Embodiment 6

Now, manufacturing steps of an SOI substrate in accordance with another embodiment of the invention will be described in conjunction with FIGS. 4A to 4H. Basic manufacturing steps are substantially identical to those described in conjunction with the conventional technology, the points different from the conventional technology will be described.

Figure 4A:
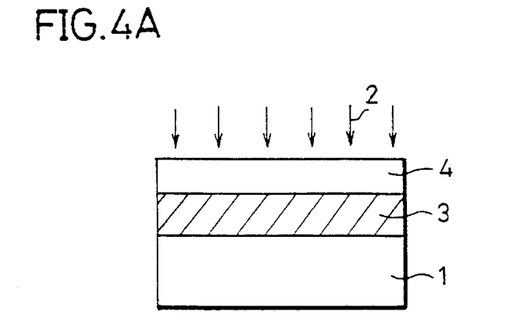
FIGS. 4A to 4H are views showing steps in a manufacturing method of an SOI substrate in accordance with Embodiment 6 of the invention.

Referring to FIG. 4A, oxygen ions 2 are implanted at an accelerating energy of 150 keV in a dose amount of $2.0 \times 10^{18}/cm^2$, and an $SiO_2$ film 3 is formed in silicon substrate 1 as a result. By formation of $SiO_2$ film 3, a silicon layer 4 is present on $SiO_2$ film 3.

Figure 4B:
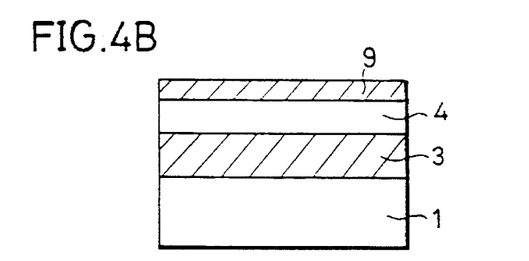
Figure 4C:
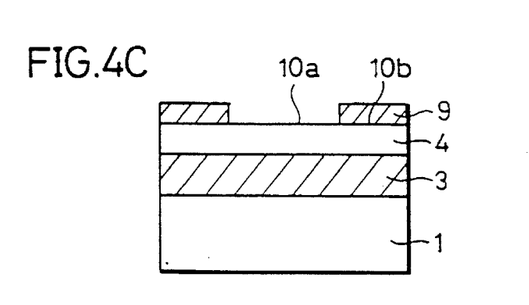

Referring to FIGS. 4B and 4C, an $SiO_2$ thin film 9 of 300 Å is formed in an element isolation region 10b utilizing a usual patterning technique and a surface of silicon layer 4 is exposed in an element formation region 10a.

Figure 4D:
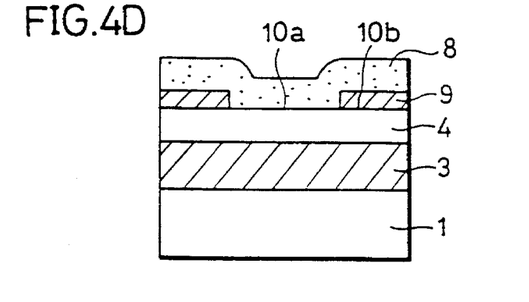

Referring to FIG. 4D, a polysilicon layer 8 of 5000 Å is formed on the entire surface of silicon substrate 1. With polysilicon layer 8 being formed, a heat treatment is performed to silicon layer 4 in an atmosphere of $Ar+1\%O_2$ at a temperature 1300° C. for six hours.

Figure 4E:
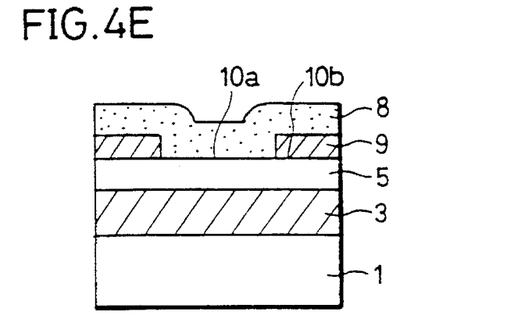

Referring to FIG. 4E, the crystal quality of silicon layer 4 is improved by the above-described heat treatment, and an SOI layer 5 of 1000 Å is provided as a result.

Figure 4F:
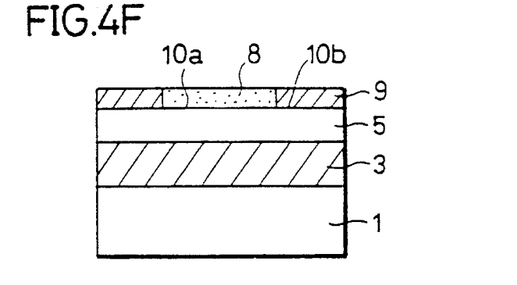

Referring to FIG. 4F, polysilicon layer 8 is ground away utilizing $SiO_2$ thin film 9 as a stopper layer. Thus, $SiO_2$ thin film 9 and polysilicon layer 8 have substantially identical film thicknesses. Thereafter, $SiO_2$ thin film 9 is removed away by selective etching.

Figure 4G:
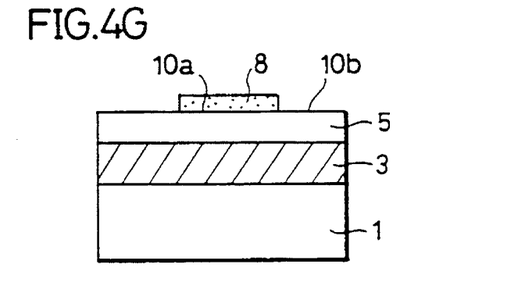

Referring to FIG. 4G, the surface of SOI layer 5 is exposed in the element isolation region 10b by this etching process, and polysilicon layer 8 is left behind only on the element isolation region 10a. Thereafter, polysilicon layer 8 is removed away by selective etching.

Figure 4H:
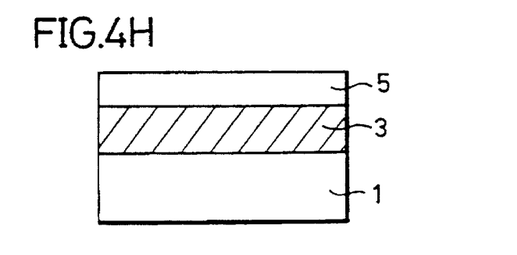

Referring to FIG. 4H, an SOI substrate of a good quality having an SOI layer 5 with an improved crystal quality is formed.

In the manufacturing method in accordance with the embodiment, if oxygen ion implantation conditions for SOI layer 5 to have a thickness of 1000 Å are employed, the formation of threading dislocations in SOI layer 5 can be restrained by the function of polysilicon layer 8 stacked on silicon layer 4 (described in detail in conjunction with Embodiment 1), and SOI layer 5 with the improved crystal quality can be provided. Furthermore, by the effect of $SiO_2$ thin film 9 as a stopper layer, the thickness of polysilicon layer 8 can be as thin as 300 Å, thus reducing time required for etching polysilicon layer 8, and therefore SOI layer can be prevented from being overetched in accordance with the etching of polysilicon layer 8. Thus, an SOI substrate having SOI layer 5 with a better film thickness evenness than Embodiment 1 is provided.

The dislocation density of SOI substrate according to the conventional manufacturing method is $10 \times 10^8/cm^2$ while the dislocation density of SOI substrate produced by employing the embodiment is $1.0 \times 10^3/cm^2$. More specifically, compared to the conventional example, the dislocation density of SOI substrate is tremendously reduced, and the crystal quality is greatly improved. Furthermore, as to the evenness of film thickness, by employing the embodiment, a film thickness evenness of $0.1 \pm 0.01$ μm as in the same level as the SOI substrate according to the conventional manufacturing method which does not use polysilicon layer 8 can be successfully achieved.

Embodiment 7

In Embodiment 6, although polysilicon layer 8 is selectively etched away after $SiO_2$ thin film 9 is selectively etched away, an SOI substrate of a good quality with an improved crystal quality can be formed as with Embodiment 6 by selectively etching $SiO_2$ thin film 9 after selectively etching polysilicon layer 8.

As in the foregoing, in the manufacturing methods according to the first and second aspects of the invention, a silicon oxide layer is formed by ion implantation and heat treatment after a polycrystalline silicon layer is formed on a main surface of a silicon substrate. Accordingly, generation of threading dislocations in the silicon layer can be prevented. Furthermore, the depth to which oxygen ions are implanted can be reduced by the thickness of polycrystalline silicon layer, and therefore the thickness of silicon layer can be reduced.

In the manufacturing method according to the third aspect of the invention, a heat treatment is performed with a polycrystalline silicon layer being formed on an element isolation region. Accordingly, generation of threading dislocations in the silicon layer under the element formation region can be prevented. The thickness of polycrystalline silicon layer is reduced, and then the remaining polycrystalline silicon layer is etched away. Therefore, the underlying silicon layer can be prevented from being overetched in accordance with the etching of the polycrystalline silicon layer, and a silicon layer with an even thickness can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an SOI substrate, comprising the steps of:

forming a silicon oxide layer at a position in a prescribed depth from said main surface by implanting oxygen ions into said silicon substrate from the main surface of silicon substrate having an element formation region and an element isolation region;

forming a silicon oxide film on said element isolation region;

forming a polycrystalline silicon layer on said element formation region and said silicon oxide film;

performing a heat treatment to a region of said silicon substrate between said silicon oxide layer and said polycrystalline silicon layer;

after said heat treatment, exposing a surface of said silicon oxide film and removing said polycrystalline silicon layer so as to leave the polycrystalline silicon layer on the element formation region;

removing said silicon oxide film; and removing said polycrystalline silicon layer by etching.

* * * * *